US012776775B2

(12) United States Patent
Shu

(10) Patent No.: US 12,776,775 B2
(45) Date of Patent: Oct. 27, 2026

(54) PIEZOELECTRIC TRANSDUCER AND PRESSURE SENSING BUTTON

(71) Applicant: AAC Acoustic Technologies (Shanghai) Co., Ltd., Shanghai (CN)

(72) Inventor: Chengxiang Shu, Shanghai (CN)

(73) Assignee: AAC Acoustic Technologies (Shanghai) Co., Ltd., Shanghai (CN)

( * ) Notice: Subject to any disclaimer, the term of this patent is extended or adjusted under 35 U.S.C. 154(b) by 329 days.

(21) Appl. No.: 18/733,604

(22) Filed: Jun. 4, 2024

(65) Prior Publication Data

US 2025/0192779 A1 Jun. 12, 2025

Related U.S. Application Data

(63) Continuation of application No. PCT/CN2023/137317, filed on Dec. 8, 2023.

(51) Int. Cl.
*H03K 17/96* (2006.01)

(52) U.S. Cl.
CPC . *H03K 17/964* (2013.01); *H03K 2217/96015* (2013.01)

(58) Field of Classification Search
CPC .................. H03K 17/964; H03K 2217/96015
See application file for complete search history.

(56) References Cited

U.S. PATENT DOCUMENTS

| | | | | |
|---|---|---|---|---|
| 10,819,838 B2 * | 10/2020 | Shi | G08B 25/016 |
| 12,633,472 B2 * | 5/2026 | Shu | H01H 13/10 |
| 2008/0092354 A1 * | 4/2008 | Clingman | H10N 30/03 29/25.35 |
| 2024/0341197 A1 * | 10/2024 | Shu | H10N 30/302 |
| 2025/0182983 A1 * | 6/2025 | Shu | H01H 13/20 |

* cited by examiner

*Primary Examiner* — Stephanie E Bloss
*Assistant Examiner* — Diana Hancock
(74) *Attorney, Agent, or Firm* — Wiersch Law Group

(57) ABSTRACT

The present disclosure provides a piezoelectric transducer and a pressure sensing button. The piezoelectric transducer includes as follows: A piezoelectric ceramic having a shape of a sheet. An upper elastic sheet and a lower elastic sheet disposed on two opposite sides of the piezoelectric ceramic, respectively. Two ends of the upper elastic sheet are fixed to an upper surface of the piezoelectric ceramic. Two ends of the lower elastic sheet are fixed to a lower surface of the piezoelectric ceramic. A plurality of resistive layers fixed to the upper elastic sheet and the lower elastic sheet, respectively, and the plurality of resistive layers are electrically connected to each other to form a bridge structure. The piezoelectric transducer of the present disclosure can recognize the external force applied to the pressure sensing button through the resistance change and realize the pressure change detection.

14 Claims, 6 Drawing Sheets

A-A

PIEZOELECTRIC TRANSDUCER AND PRESSURE SENSING BUTTON

CROSS REFERENCE TO RELATED APPLICATIONS

The present application is a continuation of PCT Patent Application No. PCT/CN2023/137317 entitled "PIEZOELECTRIC TRANSDUCER AND PRESSURE SENSING BUTTON," filed Dec. 8, 2023, which is incorporated by reference herein in its entirety.

TECHNICAL FIELD

The present disclosure relates to the technical field of button devices, in particular to a piezoelectric transducer and a pressure sensing button.

BACKGROUND

Piezoelectric ceramics is a class of electronic ceramic materials with piezoelectric properties, the current related technology has applied piezoelectric ceramic devices in cell phones, watches, and other electronic products such as buttons and other components, so as to realize the sensing and vibration functions, and the current related technology has achieved good user experience effect and market response. Related technology piezoelectric ceramic devices of the related technology are mainly bow transducer and cymbal transducer structure.

However, the related technology utilizes the button scheme of piezoelectric ceramic devices, in which the transducer structure is bonded to the piezoelectric ceramic plate with the upper and lower bow-shaped or cymbal-shaped metal structures, which are fixed by glue. The current transducer structure has insufficient ability to detect constant force and cannot realize gesture functions such as detecting pressure changes to recognize sliding press positioning.

Therefore, it is necessary to provide a new piezoelectric transducer and a pressure sensing button to solve the above problems.

SUMMARY

The present disclosure is intended to provide a piezoelectric transducer and a pressure sensing button which can detect pressure changes.

In a first aspect, some embodiments of the present disclosure provide a piezoelectric transducer. The piezoelectric transducer includes as follows: A piezoelectric ceramic having a sheet-like shape. An upper elastic sheet and a lower elastic sheet disposed on two opposite sides of the piezoelectric ceramic, respectively. Two ends of the upper elastic sheet are fixed to an upper surface of the piezoelectric ceramic, and the upper elastic sheet is at least partially spaced from the piezoelectric ceramic. Two ends of the lower elastic sheet are fixed to a lower surface of the piezoelectric ceramic, and the lower elastic sheet is at least partially spaced from the piezoelectric ceramic. A plurality of resistive layers fixed to the upper elastic sheet and the lower elastic sheet, respectively, and the plurality of resistive layers are electrically connected to each other to form a bridge structure.

As an improvement, the upper elastic sheet includes as follows: a first base portion located on the upper surface of the piezoelectric ceramic and spaced apart from the piezoelectric ceramic. A first bending portion and a second bending portion extending at an incline angle from two ends of the first base portion in a direction of proximity to two ends of the piezoelectric ceramic, respectively. A first fixing portion and a second fixing portion extending from the first bending portion and the second bending portion, respectively, and the first fixing portion and the second fixing portion are fixed to the piezoelectric ceramic. And the lower elastic sheet includes as follows: a second base portion disposed on a lower surface of the piezoelectric ceramic and spaced apart from the piezoelectric ceramic. A third bending portion and a fourth bending portion extending at an incline angle in a direction proximate to two ends of the piezoelectric ceramic from two ends of the second base portion, respectively. A third fixing portion and a fourth fixing portion extending from the third bending portion and the fourth bending portion, respectively, and the third fixing portion and the fourth fixing portion are fixed to the piezoelectric ceramic. The plurality of resistive layers includes four resistive layers, and the four resistive layers are affixed and fixed to the first bending portion, the second bending portion, the third bending portion and the fourth bending portion, respectively. And the four resistive layers are connected to each other by FPC.

As an improvement, the four resistive layers are connected to form a Whiston bridge structure.

As an improvement, each of the plurality of resistive layers is a varistor.

As an improvement, each of the plurality of resistive layers are affixed to a side of the first bending portion, a side of the second bending portion, a side of the third bending portion and a side of the fourth bending portion, respectively, away from the piezoelectric ceramic As an improvement, the first fixing portion are fixed to the piezoelectric ceramic through a first adhesive layer, and the second fixing portion is fixed to the piezoelectric ceramic through a second adhesive layer.

As an improvement, the third fixing portion are fixed to the piezoelectric ceramic through a third adhesive layer, and the fourth fixing portion is fixed to the piezoelectric ceramic through a fourth adhesive layer.

In a second aspect, some embodiments of the present disclosure provide a pressure sensing button. The pressure sensing button includes a shell and a piezoelectric transducer as described above that housed in the shell. The piezoelectric transducer includes as follows: A piezoelectric ceramic having a sheet-like shape. An upper elastic sheet and a lower elastic sheet disposed on two opposite sides of the piezoelectric ceramic, respectively. Two ends of the upper elastic sheet are fixed to an upper surface of the piezoelectric ceramic, and the upper clastic sheet is at least partially spaced from the piezoelectric ceramic. Two ends of the lower elastic sheet are fixed to a lower surface of the piezoelectric ceramic, and the lower elastic sheet is at least partially spaced from the piezoelectric ceramic. A plurality of resistive layers fixed to the upper elastic sheet and the lower elastic sheet, respectively, and the plurality of resistive layers are electrically connected to each other to form a bridge structure. The pressure sensing button further includes a button bar covered with the shell and covering the piezoelectric transducer. The upper elastic sheet is abutted against the button bar, and the lower elastic sheet is abutted against the shell.

As an improvement, the upper elastic sheet includes as follows: A first base portion located on the upper surface of the piezoelectric ceramic and spaced apart from the piezoelectric ceramic. A first bending portion and a second bending portion extending at an incline angle from two ends of the first base portion in a direction of proximity to two ends of the piezoelectric ceramic, respectively. A first fixing portion and a second fixing portion extending from the first bending portion and the second bending portion, respectively, and the first fixing portion and the second fixing portion are fixed to the piezoelectric ceramic. And the lower elastic sheet includes as follows: a second base portion disposed on a lower surface of the piezoelectric ceramic and spaced apart from the piezoelectric ceramic. A third bending portion and a fourth bending portion extending at an incline angle in a direction proximate to two ends of the piezoelectric ceramic from two ends of the second base portion, respectively. A third fixing portion and a fourth fixing portion extending from the third bending portion and the fourth bending portion, respectively, and the third fixing portion and the fourth fixing portion are fixed to the piezoelectric ceramic. The plurality of resistive layers includes four resistive layers, and the four resistive layers are affixed and fixed to the first bending portion, the second bending portion, the third bending portion and the fourth bending portion, respectively. And the four resistive layers are connected to each other by FPC.

As an improvement, the four resistive layers are connected to form a Whiston bridge structure.

As an improvement, each of the plurality of resistive layers is a varistor.

As an improvement, each of the plurality of resistive layers are affixed to a side of the first bending portion, a side of the second bending portion, a side of the third bending portion and a side of the fourth bending portion, respectively, away from the piezoelectric ceramic As an improvement, the first fixing portion are fixed to the piezoelectric ceramic through a first adhesive layer, and the second fixing portion is fixed to the piezoelectric ceramic through a second adhesive layer.

As an improvement, the third fixing portion are fixed to the piezoelectric ceramic through a third adhesive layer, and the fourth fixing portion is fixed to the piezoelectric ceramic through a fourth adhesive layer.

Compared to the related art, the piezoelectric transducer of the present disclosure includes a piezoelectric ceramic in the form of a sheet, and an upper elastic sheet and a lower elastic sheet disposed on two opposite sides of the piezoelectric ceramic, respectively. Two ends of the upper elastic sheet are fixed to the upper surface of the piezoelectric ceramic, and the upper elastic sheet is spaced at least partially from the piezoelectric ceramic. Two ends of the lower elastic sheet are fixed to the lower surface of the piezoelectric ceramic, and the lower elastic sheet is at least partially spaced from the piezoelectric ceramic. The piezoelectric transducer further includes a plurality of resistor layers that are fixed to the upper elastic sheet and the lower elastic sheet, respectively, and the plurality of the resistance layers are electrically connected with each other to form a bridge structure. In the above structure, the bending portion of the elastic sheet will shrink and deform when it is subjected to pressure, and the deformation triggers the deformation of the resistive layer, and the resistive layer under deformation induces a linear change in resistance value, such that the external force on the pressure sensing button can be identified through the change of the resistance value, and the detection of pressure change can be realized.

BRIEF DESCRIPTION OF THE DRAWINGS

For clearer descriptions of the technical solutions according to the embodiments of the present disclosure, drawings that are to be referred for description of the embodiments are briefly described hereinafter. Apparently, the drawings described hereinafter merely illustrate some embodiments of the present disclosure. A person of ordinary skill in the art may also derive other drawings based on the drawings described herein without any creative effort.

DETAILED DESCRIPTION OF THE EMBODIMENTS

Figure 1:
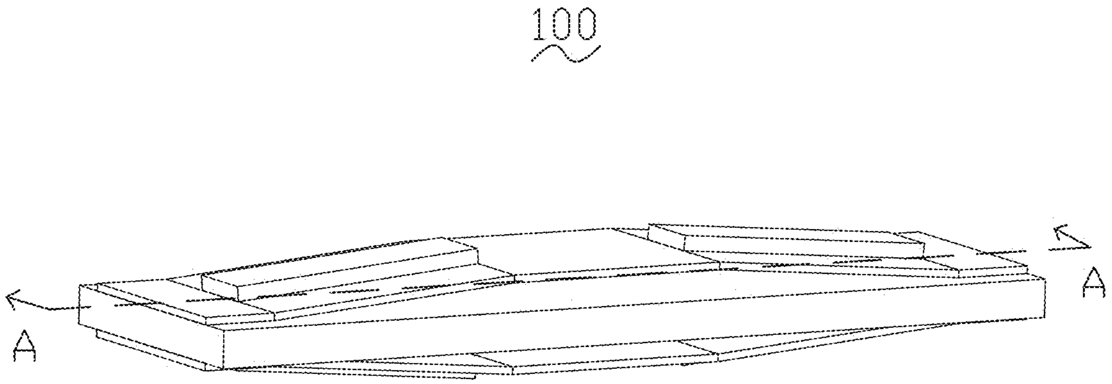
FIG. 1 shows a schematic diagram of the three-dimensional structure of the piezoelectric transducer of the present disclosure.

Unless defined otherwise, all technical and scientific terms used herein have the same meaning as commonly understood by one of ordinary skill in the art to which the present disclosure pertains. The terms used herein in the specification of present disclosure are only intended to illustrate the specific embodiments of the present disclosure, instead of limiting the present disclosure. The terms "comprise," "include," and any variations thereof in the specification and claims of the present disclosure and in the description of the drawings are intended to cover a non-exclusive inclusion. Terms such as "first," "second," and the like in the specifications, claims or the accompanying drawings of the present disclosure are intended to distinguish different objects, but are not intended to define a specific sequence.

The terms "example" and "embodiment" in this specification signify that the specific characteristic, structures, or features described with reference to the embodiments may be covered in at least one embodiment of the present disclosure. This term, when appearing in various positions of the description, neither indicates the same embodiment, nor indicates an independent or optional embodiment that is exclusive of the other embodiments. A person skilled in the art would implicitly or explicitly understand that the embodiments described in this specification may be incorporated with other embodiments.

It should be noted that the expressions "upper," "lower," "left," "right," and the like mentioned in the embodiments of the present disclosure are described with reference to the placement states in the drawings, and should not be construed as limiting the embodiments of the present disclosure. Furthermore, it should also be understood that when an element is referred to as being "over" or "under" another element, it is possible that the element directly constitutes "over" or "under" the other element, or that the element constitutes "over" or "under" the other element through intervening elements.

The technical solutions in the embodiments of the present disclosure are described in detail clearly and completely hereinafter with reference to the accompanying drawings for the embodiments of the present disclosure. Apparently, the described embodiments are only a portion of embodiments of the present disclosure, but not all the embodiments of the present disclosure. Based on the embodiments of the present disclosure, all other embodiments derived by persons of ordinary skill in the art without any creative efforts shall fall within the protection scope of the present disclosure.

First Embodiment

Figure 2:
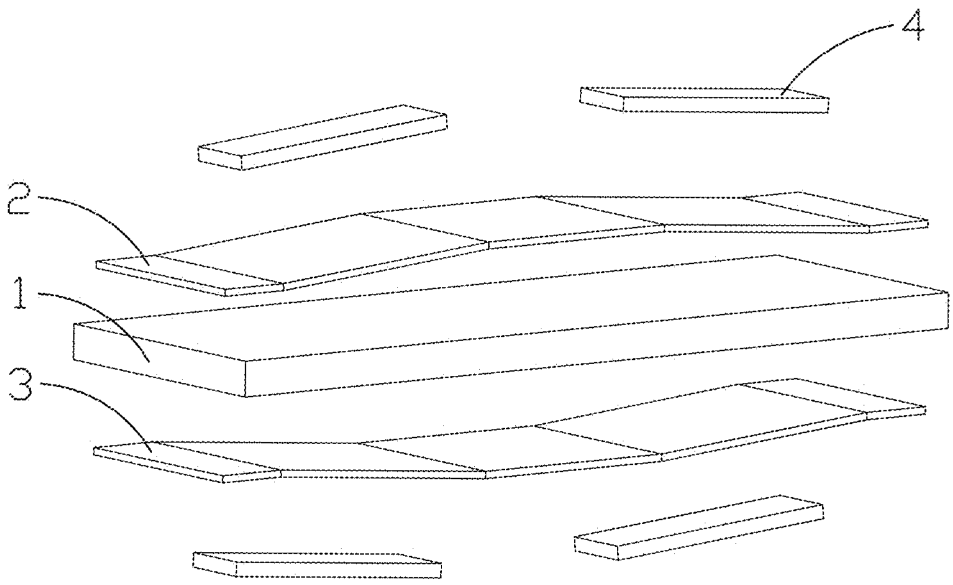
FIG. 2 is a schematic diagram of the overall disassembled structure of the piezoelectric transducer of the present disclosure.
Figure 3:
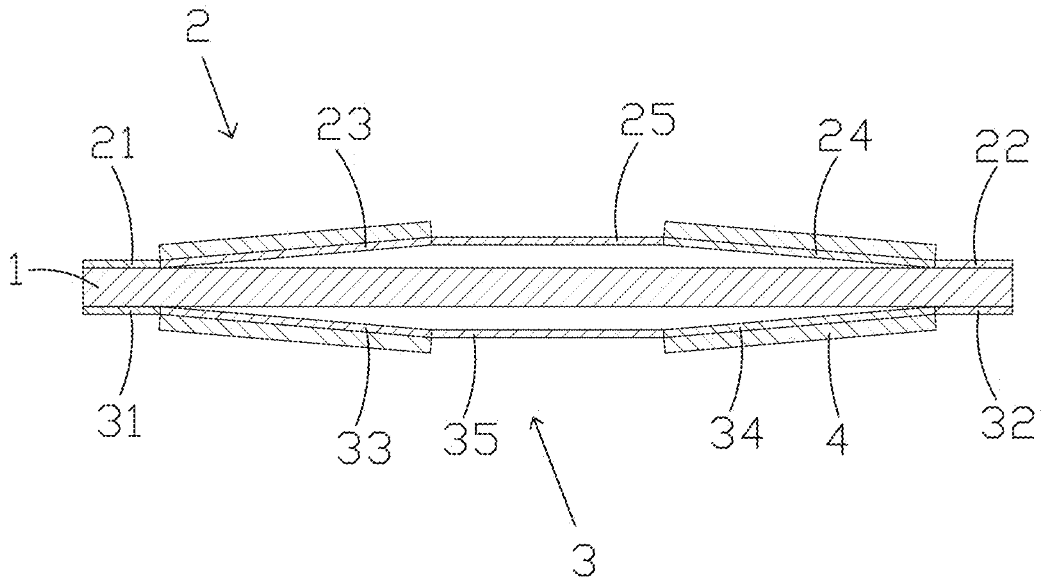
FIG. 3 is a sectional diagram along line A-A in FIG. 1.

Referring to FIG. 1 to FIG. 3, the present disclosure provides a piezoelectric transducer 100. The piezoelectric transducer 100 includes a piezoelectric ceramic 1 having a sheet-like shape, further includes an upper elastic sheet 2 and a lower elastic sheet 3 provided on two opposite sides of the piezoelectric ceramic 1, respectively. Two ends of the upper elastic sheet 2 are respectively fixed to the upper surface of the piezoelectric ceramic 1, and the upper clastic sheet 2 is provided at least partially separated from the piezoelectric ceramic 1. Two ends of the lower elastic sheet 3 are respectively fixed to the lower surface of the piezoelectric ceramic 1, and the lower elastic sheet 3 is provided at least partially separated from the piezoelectric ceramic 1.

The piezoelectric transducer 100 further includes a plurality of resistive layers 4 that are fixed to the upper elastic sheet 2 and the lower elastic sheet 3, respectively. The plurality of resistive layers 4 are electrically connected to each other to form a bridge structure.

In one example, the piezoelectric transducer 100 further includes a plurality of resistive layers 4 that are secured to a first bend portion 23, a second bend portion 24, a third bend portion 33 and a fourth bend portion 34, respectively.

In one example, the upper elastic sheet 2 includes a first base portion 25 located on the upper surface of the piezoelectric ceramic 1 and spaced apart from the piezoelectric ceramic 1, and further includes a first bending portion 23 and a second bending portion 24 that are extending at an inclined angle from two ends of the first base portion 25 in a direction of proximity to two ends of the piezoelectric ceramic 1, respectively. The upper elastic sheet 2 further includes a first fixing portion 21 and a second fixing portion 22 that are extending from the first bending portion 23 and the second bending portion 24, respectively. And the first fixing portion 21 and the second fixing portion 22 are fixed to the piezoelectric ceramic 1.

The lower elastic sheet 3 includes a second base portion 35 located on the lower surface of said piezoelectric ceramic 1 and spaced apart from said piezoelectric ceramic 1, and further includes a third bending portion 33 and a fourth bending portion 34 that are extending at an incline from two ends of the second base portion 35 in a direction of proximity to two ends of the piezoelectric ceramic 1, respectively. The lower elastic sheet 3 further includes a third fixing portion 31 and a fourth fixing portion 32. The third fixing portion 31 and the fourth fixing portion 32 are extending from the third folding part 33 and the fourth folding part 34, respectively. And the third fixing portion 31 and the fourth fixing portion 32 are fixed to the piezoelectric ceramic 1.

The plurality of resistive layers 4 includes four resistive layers 4 that are affixed and fixed to the first bending portion 23, the second bending portion 24, the third bending portion 33 and the fourth bending portion 34, respectively. And the four resistive layers 4 are connected to each other by FPC (Flexible Printed Circuit).

The plurality of resistive layers 4 are affixed to a side of the first bending portion 23, a side of the second bending portion 24, a side of the third bending portion 33, and a side of the fourth bending portion 34, respectively, away from the piezoelectric ceramic 1.

The gap formed between the upper elastic sheet 2 and the piezoelectric ceramic 1, and the gap formed between the lower elastic sheet 3 and the piezoelectric ceramic 1 are used for the space reserved for deformation of the clastic sheet (i.e., one or both of the upper elastic sheet 2 and the lower elastic sheet 3) caused by the external force.

In one example, both of the gap between the upper elastic sheet 2 and the piezoelectric ceramic 1 and the gap between the lower elastic sheet 3 and the piezoelectric ceramic 1 are reduced, when the upper elastic sheet 2 and the lower elastic sheet 3 are subjected to deformation generated by an external force. In order to avoid the damage of the plurality of resistive layers 4 disposed on the first bending portion 23, the second bending portion 243, the third bending portion 33, and the fourth bending portion 34 due to the spatial extrusion contact between the elastic sheet (i.e., one or both of the upper elastic sheet 2 and the lower elastic sheet 3) and the piezoelectric ceramic 1, the plurality of resistive layers 4 may be affixed and fixed to a side of the first bending portion 23, a side of the second bending portion 24, a side of the third bending portion 33 and a side of the fourth bending portion 34, respectively, away from the piezoelectric ceramic 1 by means of adhesive layer bonding. The size of the space between the external pushbutton structure and the piezoelectric transducer 100 is easier to be controlled in manufacturing compared to the space size of the gap (i.e., one or both of the gap between the upper elastic sheet 2 and the piezoelectric ceramic 1 and the gap between the lower elastic sheet 3 and the piezoelectric ceramic 1).

The resistive layer 4 is a varistor, and the resistance value of the varistor can be changed by deformation. When the upper elastic sheet 2 and the lower elastic sheet 3 are deformed by an external force, specifically, the first bending portion 23, the second bending portion 24, the third bending portion 33 and the fourth bending portion 34 thereof are deformed. In this embodiment, the plurality of resistive layers 4 with varistor material as the material are provided at the first bending portion 23, the second bending portion 24, the third bending portion 33 and the fourth bending portion 34, respectively. Therefore, when the first bending portion 23, the second bending portion 24, the third bending portion 33, and the fourth bending portion 34 are deformed, the resistive layers 4 at the first bending portion 23, the second bending portion 24, the third bending portion 33 and the fourth bending portion 34, respectively, are deformed, such that the resistance value of each of the plurality of resistive layers 4 changes linearly due to the magnitude of the deformation force. Correspondingly, by utilizing the resistance value of the resistive layer 4, the change of the pressing force of the button can be detected by applying the pressure sensing button of the piezoelectric transducer 100, and thus the pressure detection can be realized. Variable pressure values are detected by the pressure sensing button, the variable pressure values can be applied to functions such as the sliding recognition of buttons in smart devices such as cell phones and watches, thereby the functionality of the pressure sensing button can be enriched.

The four resistive layers 4 are connected to form a Whiston bridge structure.

The resistor is an electrical device that is susceptible to environmental influences that can cause deviations in resistance efficiency, in order to minimize the above effect, in the embodiments of the present disclosure, the plurality of resistor layers 4 at the first bending portion 23, the second bending portion 24, the third bending portion 33, and the fourth bending portion 34, respectively, are electrically connected to each other through FPC or other ways to form a Whiston bridge structure. The Whiston bridge structure is based on four resistors to achieve a balanced bridge. In the implementation process, the Whiston bridge structure is connected to the press detection circuit of the button structure, which can realize the accurate detection of the resistance values and improve the accuracy of the button pressure recognition.

Figure 6:
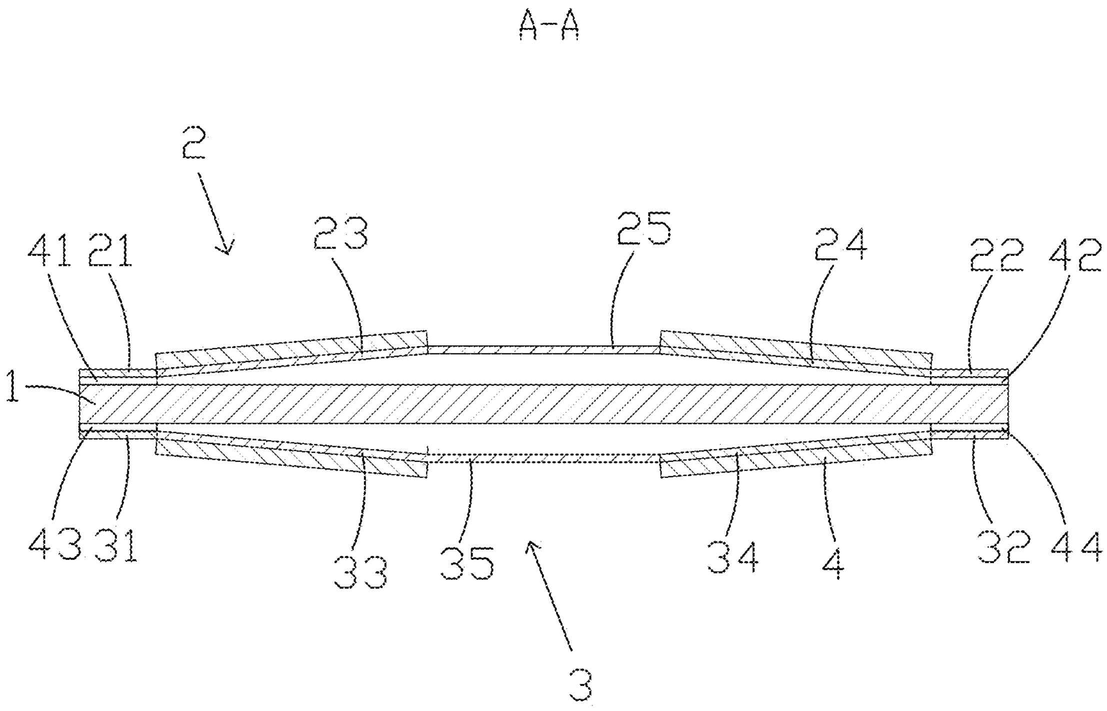
FIG. 6 is another sectional diagram along line A-A in FIG. 1.

Referring to FIG. 6, the first fixing portion 21 of the upper elastic sheet 2 is fixed to the piezoelectric ceramic 1 through a first adhesive layer 41. The second fixing portion 22 of the upper elastic sheet 2 is fixed to the piezoelectric ceramic 1 through a second adhesive layer 42.

Referring to FIG. 6, the third fixing portion 31 of the lower elastic sheet 3 is fixed to the piezoelectric ceramic 1 through a third adhesive layer 43. The fourth fixing portion 32 of the lower elastic sheet 3 is fixed to the piezoelectric ceramic 1 through a fourth adhesive layer 44.

Compared with the related technology, the piezoelectric transducer of the present disclosure includes a piezoelectric ceramic having a sheet-like shape, and an upper elastic sheet and a lower elastic sheet disposed on two opposite sides of the piezoelectric ceramic, respectively. Two ends of the upper elastic sheet are fixed to the upper surface of the piezoelectric ceramic, and the upper elastic sheet is spaced at least partially from the piezoelectric ceramic. Two ends of the lower elastic sheet are fixed to the lower surface of the piezoelectric ceramic, and the lower elastic sheet is at least partially spaced from the piezoelectric ceramic. The piezoelectric transducer further includes a plurality of resistor layers that are fixed to the upper elastic sheet and the lower elastic sheet, respectively, and the plurality of the resistance layers are electrically connected with each other to form a bridge structure. In the above structure, the bending portion of the clastic sheet will shrink and deform when it is subjected to pressure, and the deformation triggers the deformation of the resistive layer, and the resistive layer under deformation induces a linear change in resistance value, such that the external force on the pressure sensing button can be identified through the change of the resistance value, and the detection of pressure change can be realized.

Second Embodiment

Figure 4:
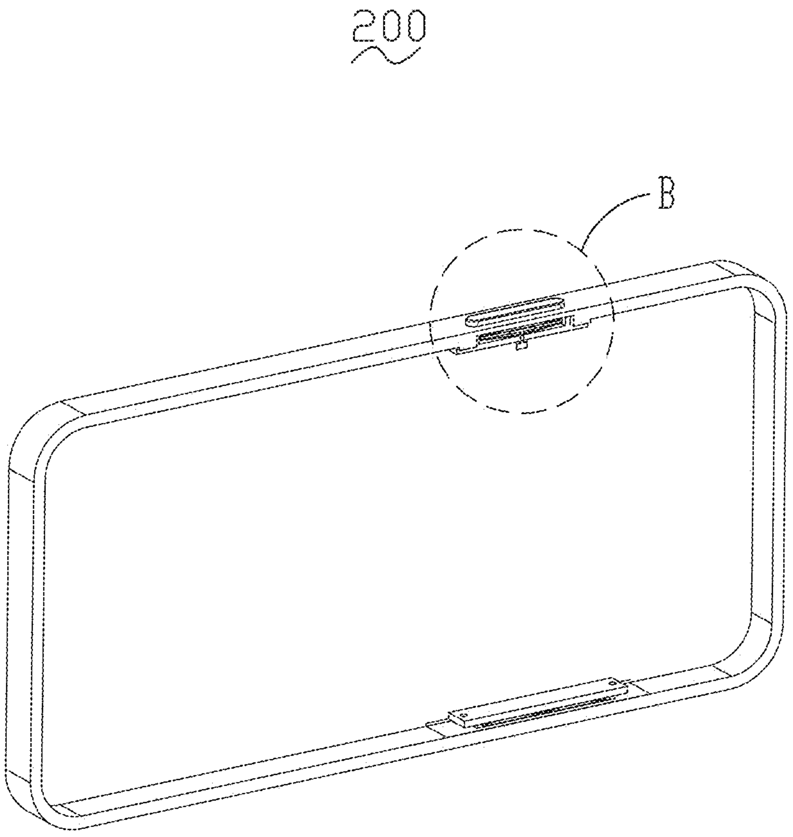
FIG. 4 shows a schematic diagram of the three-dimensional structure of the pressure sensing button of the present disclosure.
Figure 5:
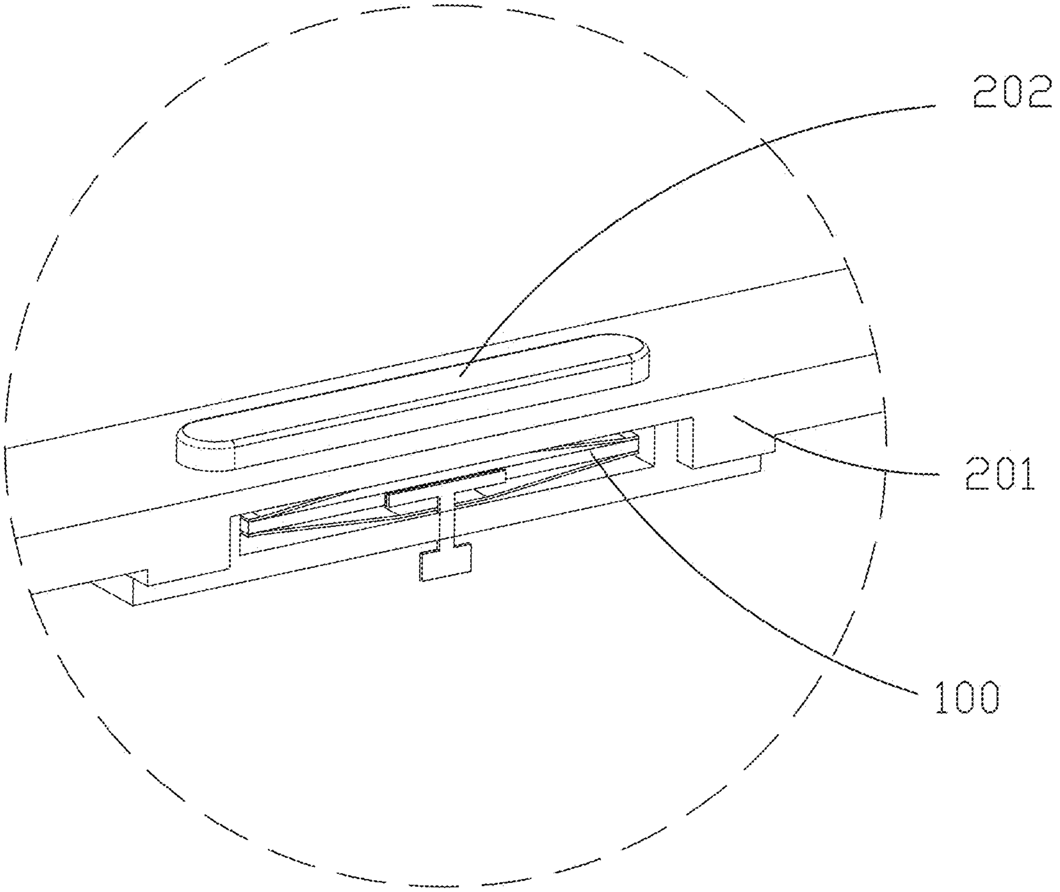
FIG. 5 shows an enlarged view of part B in FIG. 4.

This embodiment provides a pressure sensing button 200. Please refer to FIG. 4 and FIG. 5, FIG. 4 is a schematic diagram of a three-dimensional structure of the pressure sensing button provided by embodiments of the present disclosure, and FIG. 5 is an enlarged view of portion B of FIG. 4. The pressure sensing button 200 includes a shell 201, a piezoelectric transducer 100 according to the first embodiment provided in the shell 201, and a button bar 202 covered by the shell 201 and covering the piezoelectric transducer 100. The upper elastic sheet 2 is abutted against the button bar 202, and the lower elastic sheet 3 is abutted against the shell 201. In this embodiment, the detection of pressure change can be realized by identifying an external force applied to the pressure sensing button 200 through the resistance change by the piezoelectric transducer 100 having resistive layers provided at the bending portions of the elastic sheet, respectively. Variable pressure values can be detected by the pressure sensing button, and the variable pressure values can be applied to functions such as button slide recognition of smart devices such as cell phones and watches, thereby enriching the functionality of the pressure sensing button can be enriched.

The above-described is only an embodiment of the present disclosure, and it should be noted herein that improvements can be made for a person of ordinary skill in the art without departing from the inventive conception of the present disclosure, but these all fall within the scope of protection of the present disclosure.

What is claimed is:

1. A piezoelectric transducer comprising:

a piezoelectric ceramic having a shape of a sheet;

an upper elastic sheet and a lower elastic sheet disposed on two opposite sides of the piezoelectric ceramic, respectively;

wherein two ends of the upper elastic sheet are fixed to an upper surface of the piezoelectric ceramic, and the upper elastic sheet is at least partially spaced from the piezoelectric ceramic;

two ends of the lower elastic sheet are fixed to a lower surface of the piezoelectric ceramic, and the lower elastic sheet is at least partially spaced from the piezoelectric ceramic;

a plurality of resistive layers fixed to the upper elastic sheet and the lower elastic sheet, respectively, and the plurality of resistive layers are electrically connected to each other to form a bridge structure.

2. The piezoelectric transducer according to claim 1, wherein the upper elastic sheet comprises:

a first base portion located on the upper surface of the piezoelectric ceramic and spaced apart from the piezoelectric ceramic;

a first bending portion and a second bending portion extending at an incline angle from two ends of the first base portion in a direction of proximity to two ends of the piezoelectric ceramic, respectively; and a first fixing portion and a second fixing portion extending from the first bending portion and the second bending portion, respectively, and the first fixing portion and the second fixing portion are fixed to the piezoelectric ceramic;

the lower elastic sheet comprises:

a second base portion disposed on a lower surface of the piezoelectric ceramic and spaced apart from the piezoelectric ceramic;

a third bending portion and a fourth bending portion extending at an incline angle in a direction proximate to two ends of the piezoelectric ceramic from two ends of the second base portion, respectively; and a third fixing portion and a fourth fixing portion extending from the third bending portion and the fourth bending portion, respectively, and the third fixing portion and the fourth fixing portion are fixed to the piezoelectric ceramic;

the plurality of resistive layers includes four resistive layers, and the four resistive layers are affixed and fixed to the first bending portion, the second bending portion, the third bending portion and the fourth bending portion, respectively; and the four resistive layers are connected to each other by FPC.

3. The piezoelectric transducer according to claim 2, wherein the four resistive layers are connected to form a Whiston bridge structure.

4. The piezoelectric transducer according to claim 2, wherein each of the plurality of resistive layers are affixed to a side of the first bending portion, a side of the second bending portion, a side of the third bending portion and a side of the fourth bending portion, respectively, away from the piezoelectric ceramic.

5. The piezoelectric transducer according to claim 2, wherein the first fixing portion are fixed to the piezoelectric ceramic through a first adhesive layer, and the second fixing portion is fixed to the piezoelectric ceramic through a second adhesive layer.

6. The piezoelectric transducer according to claim 2, wherein the third fixing portion are fixed to the piezoelectric ceramic through a third adhesive layer, and the fourth fixing portion is fixed to the piezoelectric ceramic through a fourth adhesive layer.

7. The piezoelectric transducer according to claim 1, wherein each of the plurality of resistive layers is a varistor.

8. A pressure sensing button, comprising:

a shell; a piezoelectric transducer housed in the shell as claimed in claim 1;

a button bar covered with the shell and covering the piezoelectric transducer;

wherein the upper elastic sheet is abutted against the button bar, and the lower elastic sheet is abutted against the shell.

9. The pressure sensing button according to claim 8, wherein the upper elastic sheet comprises:

a first base portion located on the upper surface of the piezoelectric ceramic and spaced apart from the piezoelectric ceramic;

a first bending portion and a second bending portion extending at an incline angle from two ends of the first base portion in a direction of proximity to two ends of the piezoelectric ceramic, respectively; and a first fixing portion and a second fixing portion extending from the first bending portion and the second bending portion, respectively, and the first fixing portion and the second fixing portion are fixed to the piezoelectric ceramic;

the lower elastic sheet comprises:

a second base portion disposed on a lower surface of the piezoelectric ceramic and spaced apart from the piezoelectric ceramic, a third bending portion and a fourth bending portion extending at an incline angle in a direction proximate to two ends of the piezoelectric ceramic from two ends of the second base portion, respectively; and a third fixing portion and a fourth fixing portion extending from the third bending portion and the fourth bending portion, respectively, and the third fixing portion and the fourth fixing portion are fixed to the piezoelectric ceramic;

the plurality of resistive layers includes four resistive layers, and the four resistive layers are affixed and fixed to the first bending portion, the second bending portion, the third bending portion and the fourth bending portion, respectively; and the four resistive layers are connected to each other by FPC.

10. The pressure sensing button according to claim 9, wherein the four resistive layers are connected to form a Whiston bridge structure.

11. The pressure sensing button according to claim 9, wherein each of the plurality of resistive layers are affixed to a side of the first bending portion, a side of the second bending portion, a side of the third bending portion and a side of the fourth bending portion, respectively, away from the piezoelectric ceramic.

12. The pressure sensing button according to claim 9, wherein the first fixing portion are fixed to the piezoelectric ceramic through a first adhesive layer, and the second fixing portion is fixed to the piezoelectric ceramic through a second adhesive layer.

13. The pressure sensing button according to claim 9, wherein the third fixing portion are fixed to the piezoelectric ceramic through a third adhesive layer, and the fourth fixing portion is fixed to the piezoelectric ceramic through a fourth adhesive layer.

14. The pressure sensing button according to claim 8, wherein each of the plurality of resistive layers is a varistor.

* * * * *